United States Patent [19]
Lou et al.

[11] Patent Number: 5,872,045
[45] Date of Patent: Feb. 16, 1999

[54] METHOD FOR MAKING AN IMPROVED GLOBAL PLANARIZATION SURFACE BY USING A GRADIENT-DOPED POLYSILICON TRENCH—FILL IN SHALLOW TRENCH ISOLATION

[75] Inventors: Chine-Gie Lou, Hsinchu; Hsueh-Chung Chen, Taipei, both of Taiwan

[73] Assignee: Industrial Technology Research Institute, Hsin-Chu, Taiwan

[21] Appl. No.: 892,215

[22] Filed: Jul. 14, 1997

[51] Int. Cl.⁶ .................................................. H01L 21/76
[52] U.S. Cl. ...................... 438/432; 438/435; 438/692; 438/705
[58] Field of Search ..................... 438/227, 435, 438/432, 437, 691, 692, 705, 103; 148/DIG. 50, DIG. 85, DIG. 86

[56] References Cited

U.S. PATENT DOCUMENTS

| | | |
|---|---|---|
| 4,507,849 | 4/1985 | Shinozaki . |
| 4,554,728 | 11/1985 | Shepard . |
| 5,308,438 | 5/1994 | Cote et al. ............................... 156/636 |
| 5,449,314 | 9/1995 | Meikle et al. ............................. 451/41 |
| 5,616,513 | 4/1997 | Shepard . |
| 5,795,495 | 8/1998 | Meikle et al. . |

*Primary Examiner*—George Fourson
*Attorney, Agent, or Firm*—George O. Saile; Stephen B. Ackerman

[57] ABSTRACT

A method for fabricating shallow trench isolation using a gradient-doped polysilicon trench-fill and a chemical/mechanical polishing that improves substrate planarity was achieved. The method involves forming shallow trenches in a silicon substrate having a silicon nitride layer on the surface. After selectively oxidizing silicon exposed in the trenches, a second silicon nitride layer is deposited, and a composite polysilicon layer consisting of an undoped polysilicon layer and a gradient-doped polysilicon layer is deposited filling the trenches. The composite polysilicon layer is then chemical/mechanically polished back. The gradient-doped polysilicon layer improves the removal rate uniformity across the substrate (wafer) by removing the heavily doped regions at a faster rate than undoped or lightly doped regions. This results in improved global planarity which improves the polysilicon dishing in the trenches near the edge of the substrate. A step-wise doping gradient was found to achieve the best removal rate uniformity across the substrate. The undoped polysilicon remaining in the trenches is then thermally oxidized to eliminate dishing in wide trenches, and the silicon nitride layers are removed by selectively etching to complete the shallow trench isolation.

21 Claims, 7 Drawing Sheets

METHOD FOR MAKING AN IMPROVED GLOBAL PLANARIZATION SURFACE BY USING A GRADIENT-DOPED POLYSILICON TRENCH— FILL IN SHALLOW TRENCH ISOLATION

BACKGROUND OF THE INVENTION (1) Field of the Invention

The present invention relates to the fabrication of integrated circuits, and more particularly to a method for forming planarized shallow trenches across the semiconductor substrate (wafer) using a gradient-doped polysilicon trench fill and a chemical-mechanical polish back.

(2) Description of the Prior Art

Field oxide isolation is used to electrically isolate the discrete devices on semiconductor substrates for Ultra Large Scale Integration (ULSI). Typically a LOCal Oxidation of Silicon (LOCOS) is used in the semiconductor industry in which a patterned oxidation barrier mask (silicon nitride) is used and the silicon substrate is selectively oxidized. This results in long thermal budgets and in lateral oxidation under the barrier mask that limit the minimum spacing between adjacent active device areas and therefore prevents further increases in device packing densities. Also, as minimum feature sizes are further reduced, it is necessary to maintain a planar surface for exposing the higher resolution photoresist etch mask patterns, since the higher resolution induces a much shallower depth of focus (DOF). Also, the planarity is necessary for anisotropic plasma etching distortion-free patterned structures without residue in the overlying conductive and insulating layers that are later formed on the substrate. Since the expansion of the oxide in the vertical upward direction by the LOCOS method results in a more uneven topography, there is a strong desire to explore alternate isolation methods.

Figure 1:
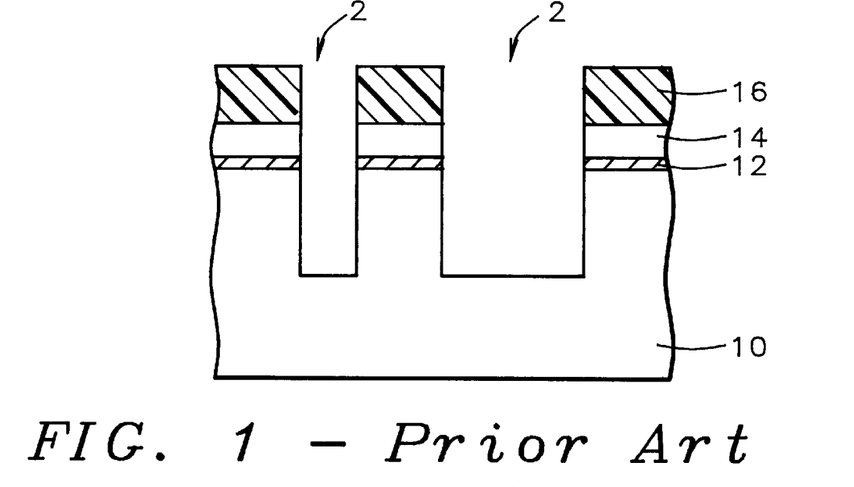
FIGS. 1 through 5 are schematic cross-sectional views showing a sequence of steps for forming a shallow trench isolation by the prior art.
Figure 2:
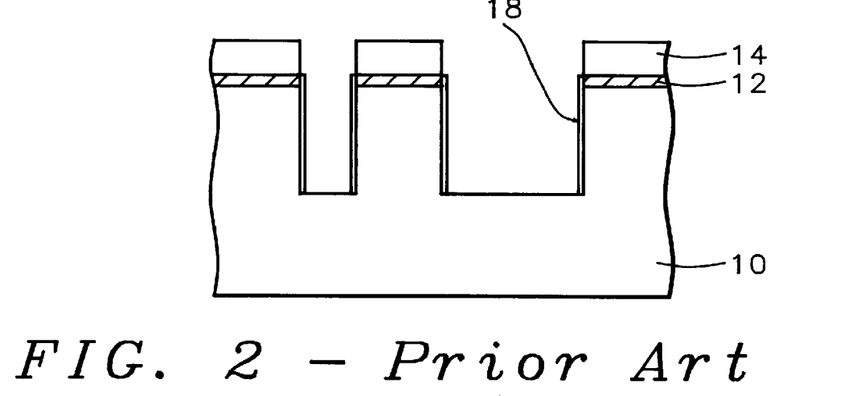
Figure 3:
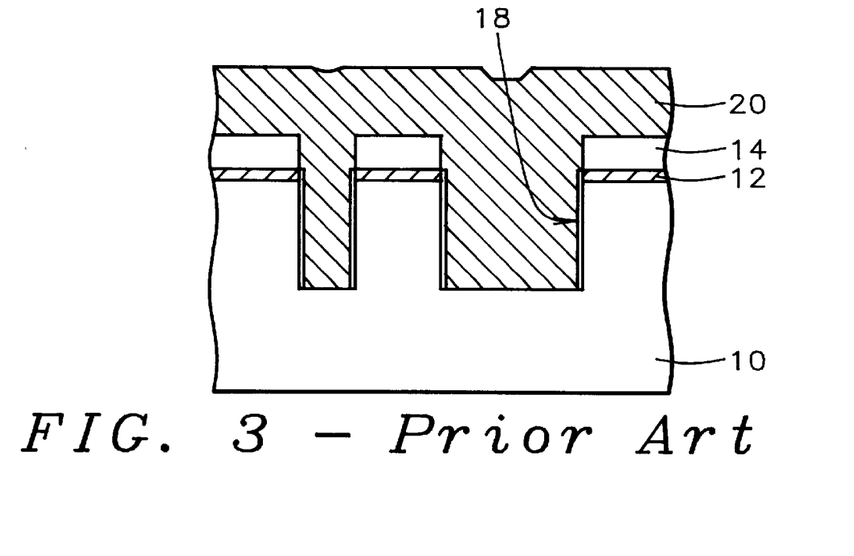
Figure 4:
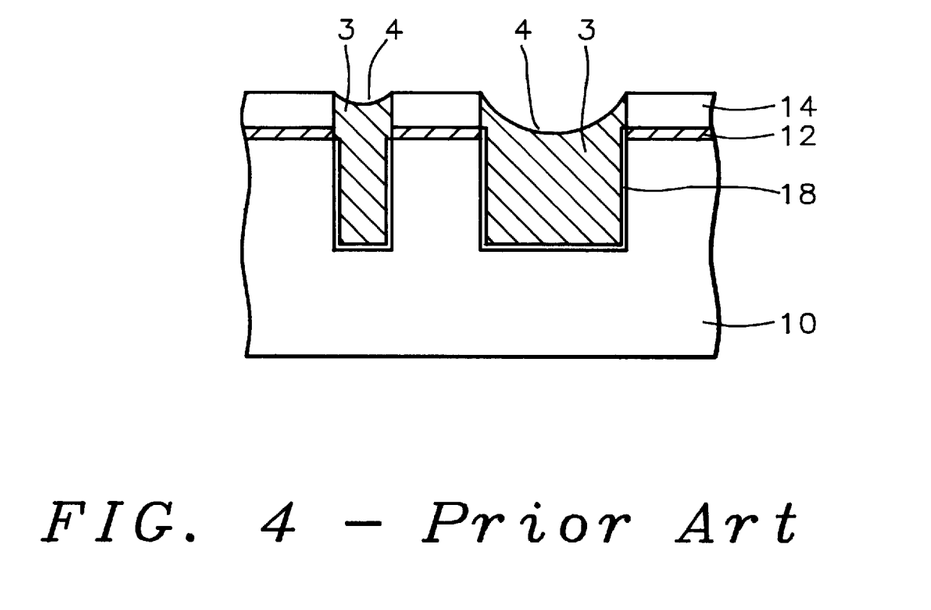
Figure 5:
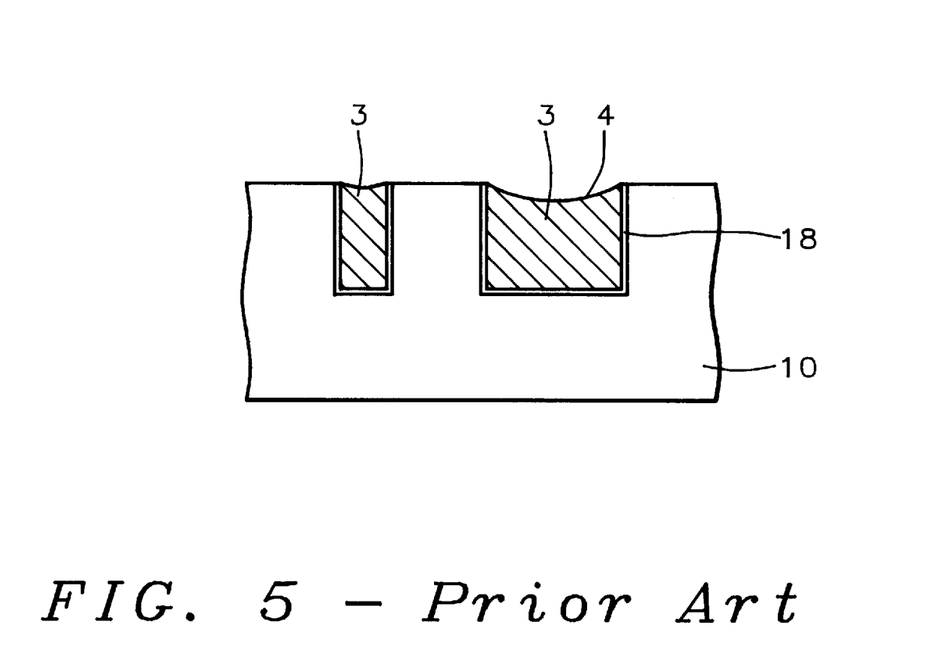

One method being explored as a replacement for the conventional LOCOS isolation is the shallow trench isolation (STI) depicted in FIGS. 1 through 5. This STI method minimizes the thermal budget, minimizes spacing between adjacent active device areas, and provides a more planar surface. The method involves filling the trenches with an oxide or undoped polysilicon which is then chemical/mechanically polished (CMP) back to form a planar structure. As shown starting with FIG. 1, the method involves growing a stress-release first thermal oxide 12 on a silicon substrate 10 and depositing a silicon nitride layer 14. Conventional photolithographic techniques and anisotropic plasma etching are used to define a photoresist mask 16 and to etch the trenches 2 in the substrate 10 where the field oxide isolation is required. As shown in FIG. 2, after removing the photoresist 16, a second thermal oxide 18 is grown on the exposed silicon surface in the trenches 2 to eliminate plasma etch damage, while the silicon nitride layer 14 prevents the oxidation of the top surface of the silicon substrate where the active device areas for fabricating the semiconductor devices are required. Next, as shown in FIG. 3, a conformal undoped polysilicon layer 20 is deposited to fill the trenches 2 (alternatively a silicon oxide ($SiO_2$) can be used). The undoped polysilicon layer 20 is then planarized by chemical/mechanical polishing back to the silicon nitride layer 14, as shown in FIG. 4 to form the polysilicon-filled trenches 3. Finally, as shown in FIG. 5, the silicon nitride layer 14 is removed by etching in a hot phosphoric acid ($H_3PO_4$) wet etch, and the first thermal oxide 12 is removed by wet etching in a buffered oxide etch (BOE) to complete the shallow trench isolation 3 surrounding the device areas on the substrate on and in which the devices are built.

The most important step in this conventional process is the polishing back according to the nature of chemical/mechanical polishing (CMP). Usually, different polishing rates cause the non-uniformity across the wafer. Moreover, the different removal rates between the filling material and the stop layer result in dishing 4, as shown in FIG. 4. Large differences in selectivity have a more serious dishing problem. Therefore, there are several disadvantages to this conventional method for using both silicon oxide and polysilicon trench filling. First, if a silicon oxide is used to fill the trenches, then an over-polishing step is necessary to ensure the silicon oxide layer has been removed completely, or the silicon nitride will not be etched out due to the residual oxide. However, there is a difficulty in the detection of endpoint because the polish back is not very highly selective to the underlying silicon nitride layer 14 (about 3:1 to 5:1), therefore, it can result in substrate damage. Thus, the time-mode control has been used instead of endpoint control in the conventional process.

The undoped polysilicon-filled trench not only results in a much better polish-back selectivity to the silicon nitride layer 14 (about 25:1), but also the latitude of process window for overpolish is enlarged. Also, the endpoint signal is much stronger, so the endpoint control is feasible. However, it also causes a more severe dishing in the wide trenches.

One method of improving the polish-back uniformity across the wafer for forming planarized dielectric layers for intermetal dielectrics (IMD) over the interconnecting conductive lines is described by Meikle et al. in U.S. Pat No. 5,449,314. The method employs a gradient-doped silicon oxide insulating layer which is then chemical/mechanically polished back. The chemical/mechanical polishing removes relatively fast the heavily doped elevated portions while removing more slowly the lightly doped regions resulting in a more global planarity across the wafer. However, Meikle does not teach or suggest the method for making STI regions on a substrate, and does not teach the use of a polysilicon for filling trenches.

Although there are a number of methods for forming shallow trenches and for planarizing dielectric layers, there is still a strong need to provide improved methods for forming shallow trenches with large overpolishing process window, an obvious endpoint, no dishing, and having a more planar surface with improved global planarity.

SUMMARY OF THE INVENTION

It is a principal object of this invention to provide a shallow trench isolation (STI) on semiconductor substrates having improved planarity and eliminating dishing in wide trenches.

It is another object of this invention to provide a step-wise dopant profile in a polysilicon trench-fill that improves the removal rate uniformity across the wafer during chemical/mechanical polishing, and thereby provide greater latitude in the process window, while avoiding excessive dishing in the trenches on chips near the perimeter (edge) of the substrate, thereby providing improved product yield and reliability.

In accordance with these objectives, the invention provides a new method for forming a shallow trench isolation with improved global planarity and without dishing in wide trenches.

The method begins by providing a semiconductor substrate, such as a single crystal silicon, which can be either N- or P-doped. A first thermal oxide layer is grown on the substrate surface to provide a stress-release layer. A first silicon nitride layer is then deposited by chemical vapor deposition on the first thermal oxide layer to provide a barrier layer to oxidation. Conventional photolithographic techniques and anisotropic plasma etching are then used to etch the first silicon nitride layer and the first thermal oxide layer and to partially etch trenches into the silicon substrate where the shallow trench isolation (STI) is desired. A second thermal oxidation is carried out to grow a second thermal oxide layer on the exposed surfaces of the silicon substrate in the trenches. This eliminates any damage caused by the plasma etching and also provides a stress-release layer for the next deposition, which is a silicon nitride. A conformal second silicon nitride layer is then deposited. Now by the method of this invention, a composite polysilicon layer is deposited composed of a lower undoped polysilicon layer sufficiently thick to fill the trenches, and an upper gradient-doped polysilicon layer on the undoped polysilicon portion. For example, the undoped polysilicon portion can be deposited in a low pressure chemical vapor deposition (LPCVD) furnace using silane ($SiH_4$) gas, and the gradient-doped polysilicon portion can be deposited in a separate in-situ doped polysilicon furnace using $SiH_4$ and phosphine ($PH_3$) gases. Alternatively, the doping can be carried out in a single furnace by introducing $PH_3$ after depositing the undoped polysilicon portion using the single reactant gas $SiH_4$, which improves throughput and lowers process cost. One preferred method of doping is achieved by a series of three or more dopant steps having consecutively increasing dopant concentrations.

The composite polysilicon layer is then polished back to the second silicon nitride layer. Since the highly doped polysilicon portion polishes at a faster rate than the lightly doped or undoped polysilicon, as the polishing progresses, the heavily doped polysilicon is removed more quickly. Typically, since the polishing rate at the perimeter (edge) of the wafer is larger than at the center of the wafer, the lightly doped polysilicon at the perimeter of the wafer is reached first and the polishing rate decreases relative to the heavily doped polysilicon at the wafer center. This improves the removal rate uniformity across the wafer and results in a more globally planar surface with improved (less) dishing of the undoped polysilicon in the trenches on chips at the perimeter of the wafer when the polysilicon is completely removed at the center of the wafer. After completing the polishing, a third thermal oxide layer is grown on the undoped polysilicon in the trenches to eliminate dishing, while the first and second silicon nitride layers prevent thermal oxidation of the substrate. The first and second silicon nitride layers are then removed by wet etching in a hot phosphoric acid, and the first thermal oxide layer is removed by wet etching in a Buffered Oxide Etch (BOE) or in a dilute hydrofluoric acid ($HF/H_2O$) to complete the shallow trench isolation.

BRIEF DESCRIPTION OF THE DRAWINGS

The objects and other advantages of this invention are best understood in the preferred embodiment with reference to the attached drawings that include:

FIGS. 6 through 11 are schematic cross-sectional views for a series of steps for fabricating the improved shallow trench isolation by the method of this invention using a composite undoped/gradient-doped polysilicon layer.

DESCRIPTION OF THE PREFERRED EMBODIMENT

The method of this invention is now described in detail. Although the method is described for a single shallow trench isolation on a silicon substrate, it should be well understood by one skilled in the art that a multitude of shallow trenches can be formed concurrently on the substrate, and further that the trenches can be formed in either P-doped or N-doped substrates, and more particularly formed in substrates having both P and N wells in and on which both N-channel and P-channel field effect transistors (FETs) and other devices can be built from which CMOS circuits can be fabricated.

Figure 6:
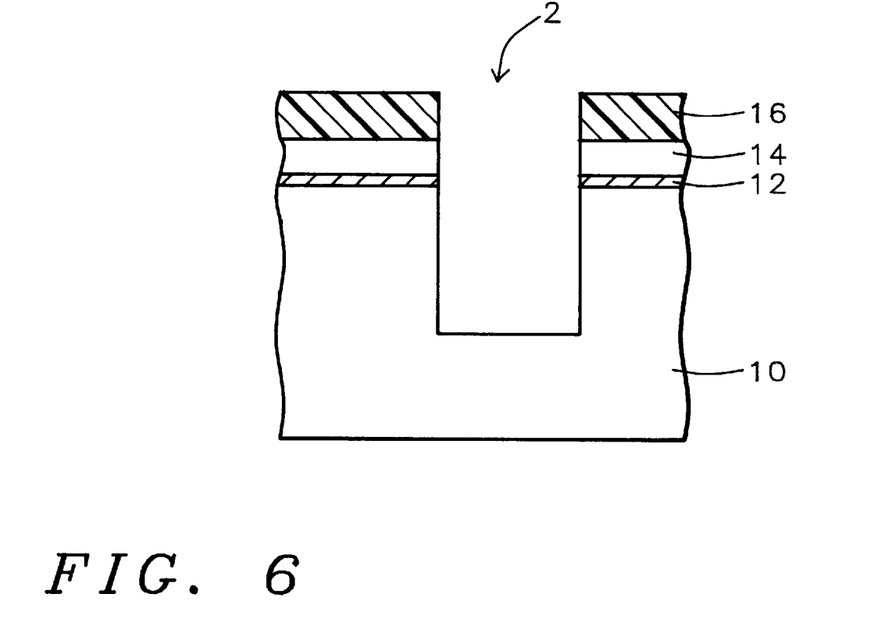

Referring now to FIG. 6, the method for forming the shallow trench isolation without dishing, and with improved global planarity begins by providing a silicon substrate 10. The preferred substrate is composed of a single crystal silicon with a <100> crystallographic orientation. Still referring to FIG. 6, a first thermal oxide layer 12 is formed on the substrate surface to provide a stress-release layer to protect the substrate from stress-induced crystalline damage. Preferably the thermal oxide 12 is formed by subjecting the substrate to a dry oxygen ambient in an oxidation furnace at a temperature of between about 850° and 1000° C. The thermal oxide is grown to a thickness of between about 200 and 300 Angstroms, and more specifically to a thickness of about 250 Angstroms. A first silicon nitride ($Si_3N_4$) layer 14 is then deposited on the first thermal oxide layer 12, which will later serve as an oxidation barrier layer. Preferably the $Si_3N_4$ layer 14 is deposited by low pressure chemical vapor deposition (LPCVD) using a reactant gas mixture such as dichlorosilane ($SiCl_2H_2$) and ammonia ($NH_3$). Layer 14 is deposited to a preferred thickness of between about 1500 and 2000 Angstroms. Next, a photoresist layer 16 is spin coated on the $Si_3N_4$ layer 14 and patterned using conventional photolithographic techniques to provide openings over the $Si_3N_4$ layer 14 where shallow trench isolation regions are required. Using the patterned photoresist layer 16 as an etch mask, anisotropic plasma etching is used to etch the first silicon nitride layer 14, the first thermal oxide layer 12, and to partially etch into the silicon substrate 10 to form shallow trenches. One such trench 2 is depicted in FIG. 6. The anisotropic plasma etching is carried out using high-density plasma etching or reactive ion etching, using, for example, a gas mixture such as trifluoromethane ($CHF_3$) and oxygen ($O_2$) for the $Si_3N_4$ etch, $CHF_3$, carbon tetrafluoride ($CF_4$), and argon (Ar) for the $SiO_2$ etch, and hydrogen bromide (HBr) and chlorine ($Cl_2$) for the silicon etch. The trenches are etched to a depth of between about 0.35 and 0.5 micrometers (um) below the substrate surface.

Figure 7:
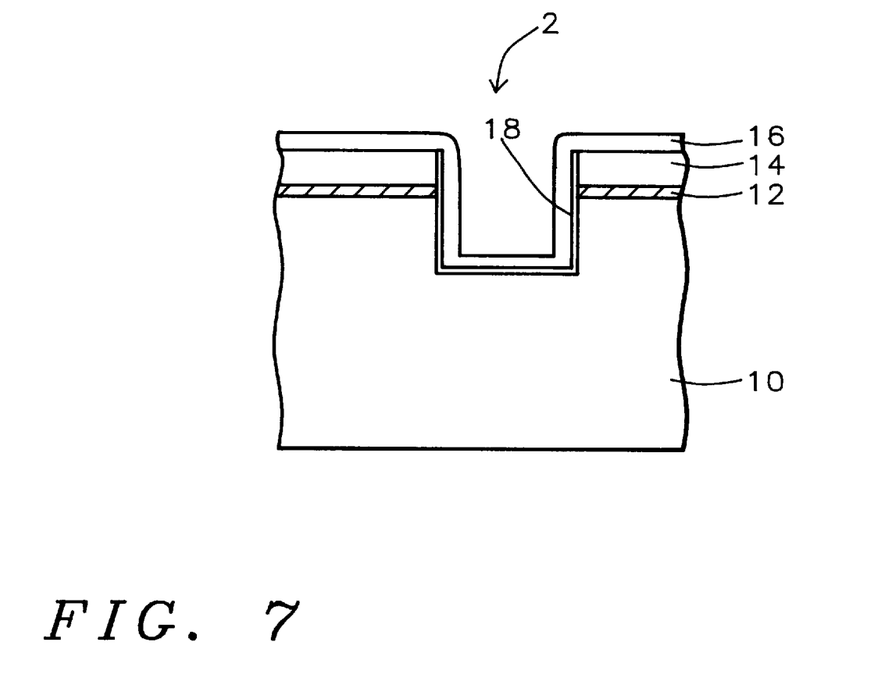

Referring now to FIG. 7, the photoresist mask 16 is stripped, such as by plasma ashing in oxygen, and a second thermal oxide layer 18 is grown on the exposed surface of the silicon substrate in the trench 2 to eliminate any damage caused by the anisotropic plasma etching, and further to provide a stress-release layer for the next deposition, which is a second silicon nitride layer. The second thermal oxide layer 18 is formed similar to the first thermal oxide layer 12, and is preferably grown to a thickness of between about 80 and 300 Angstroms.

Still referring to FIG. 7, a second silicon nitride layer 20 is then deposited on the first $Si_3N_4$ layer 14 and conformally coats the second thermal oxide layer 18 in the trenches. The second $Si_3N_4$ layer 20 will later serve as an oxidation barrier layer. Preferably the $Si_3N_4$ layer 20 is deposited similar to the deposition of the first $Si_3N_4$ layer 14 by LPCVD, and is deposited to a thickness of between about 250 and 600 Angstroms.

Figure 8A:
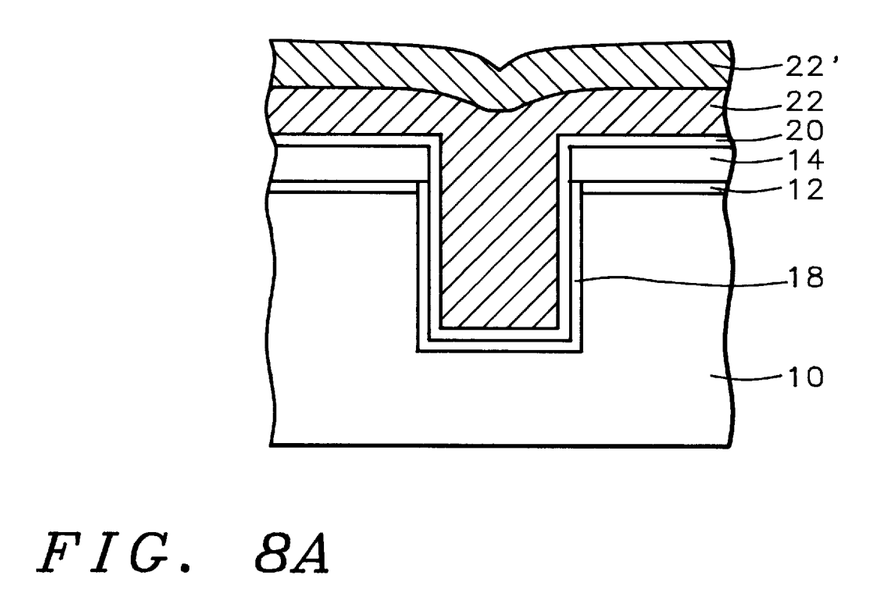
FIG. 8A depicts the composite polysilicon layer over a single trench.

Now more specifically relating to the method of this invention and referring to FIG. 8A, a composite polysilicon layer comprising an undoped polysilicon layer 22 and a gradient-doped polysilicon layer 22' is deposited next. The undoped polysilicon layer 22 is deposited in a LPCVD furnace using a reactant gas such as silane ($SiH_4$), and is deposited to a thickness sufficient to fill the trenches 2. For example, if the trench depths are between about 0.35 and 0.5 um, the undoped polysilicon layer 22 would be deposited to a thickness between about 7500 and 12000 Angstroms. The gradient-doped polysilicon layer 22' is deposited next and can be deposited in a separate in-situ doped polysilicon furnace using $SiH_4$ as the reactant gas and phosphine ($PH_3$) as the dopant gas. The preferred thickness of the gradient-doped polysilicon layer 22' is between about 2500 and 6000 Angstroms. The method for depositing the composite polysilicon layer composed of layers 22 and 22' can also be carried out in a single deposition furnace by first depositing the undoped layer 22 using $SiH_4$ and then a dopant gas, such as phosphine ($PH_3$), can be introduced into the deposition furnace to deposit the gradient-doped layer 22'. The latter method using a single furnace provides improved throughput and lowers process cost. The polysilicon layer 22' can be deposited having a linearly increasing dopant concentration with thickness, as shown by the dopant profile curve 42 in FIG. 12. After completing the deposition of layer 22', the dopant concentration C as a function of the composite polysilicon layer depth S decreases linearly with distance S from the surface of the polysilicon layer 22', while dopant curve 40 in FIG. 12 (C=0) is for the undoped polysilicon layer 22. However, by the method of this invention, the process can be further improved using a step-wise dopant profile such as depicted by the dopant profile curve 44, as shown in FIG. 13, and is the preferred method since it provides a best removal rate uniformity across the wafer during the polish-back step. The dopant concentration in either profile can have a range of between 1 weight percent and 30 weight percent, which is considerably larger than the 1 to 7% range limit used in the prior art for polishing back the intermetal dielectric layer (U.S. Pat. No. 5,449,314), and therefore provides a wider process window. The doping can be achieved by automatically controlling the flow rates of the dopant gas by computer control. Preferably the step-wise profile shown in FIG. 13 is achieved in three or more dopant steps having consecutively increasing dopant concentrations.

Figure 9:
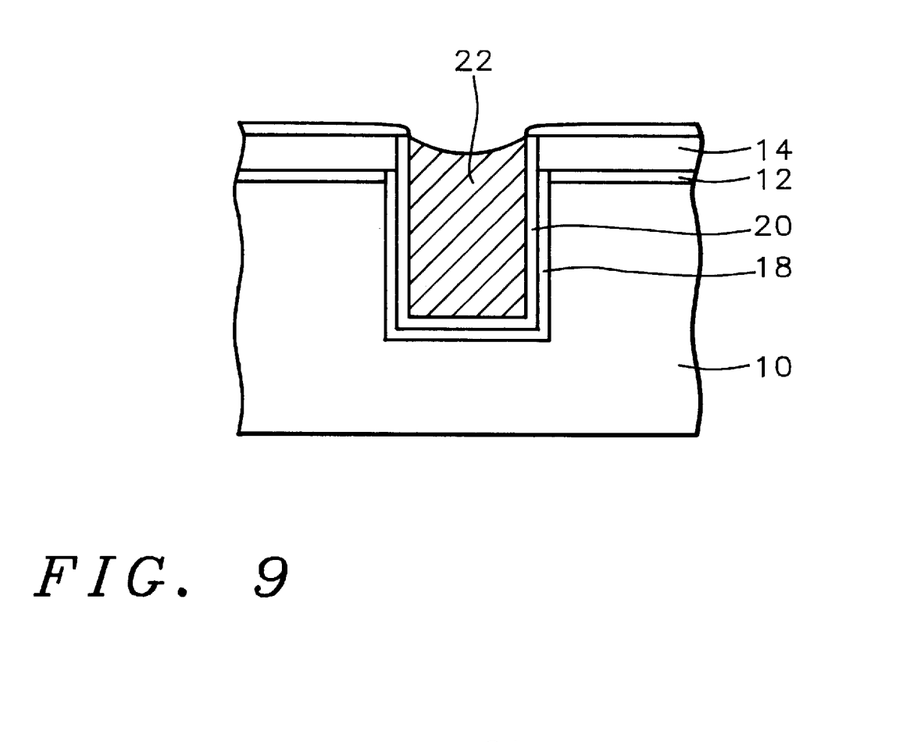

Now as shown in FIG. 9, the composite polysilicon layer (layers 22 and 221) is polished back. The polish-back is preferably carried out in a commercial polishing tool using a commercially available polishing slurry. For example, one type of polishing tool that can be used is a model type 472, manufactured by IPEC of U.S.A. Since the highly doped polysilicon portion polishes at a faster rate than the lightly doped or undoped polysilicon, as the polishing progresses, the heavily doped polysilicon is removed more quickly. Typically, since the polishing rate is higher at the perimeter of the wafer, the undoped polysilicon layer 22 is reached first and the polishing rate decreases relative to the heavily doped polysilicon 22' at the wafer center. This improves the polish-back uniformity across the wafer and results in a more globally planar surface with improved dishing of the undoped polysilicon in the trenches at the perimeter of the wafer when the polysilicon is completely removed at the center of the wafer. The method can also improve any type of non-uniformity that may occur on the wafer.

Figure 10:
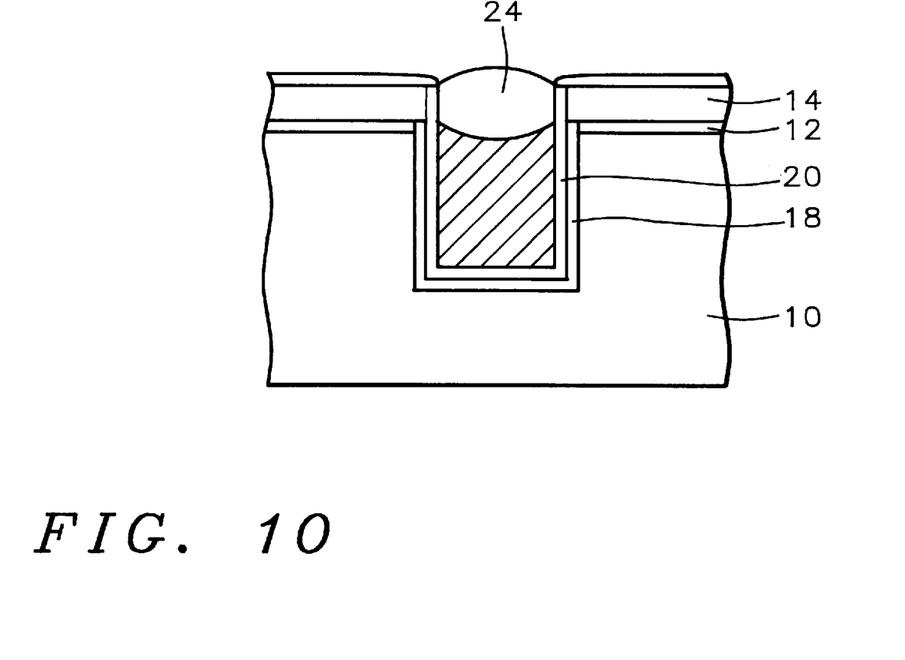

Referring to FIG. 10, a third thermal oxide layer 24 is grown on the undoped polysilicon layer 22 remaining in the trenches to eliminate dishing in wide trenches and to electrically insulate the polysilicon-filled trenches from the next level of device structures. The first and second silicon nitride layers (layers 14 and 20) prevent undesirable thermal oxidation of the silicon substrate 10 during the thermal oxidation step used to form layer 24.

Figure 11:
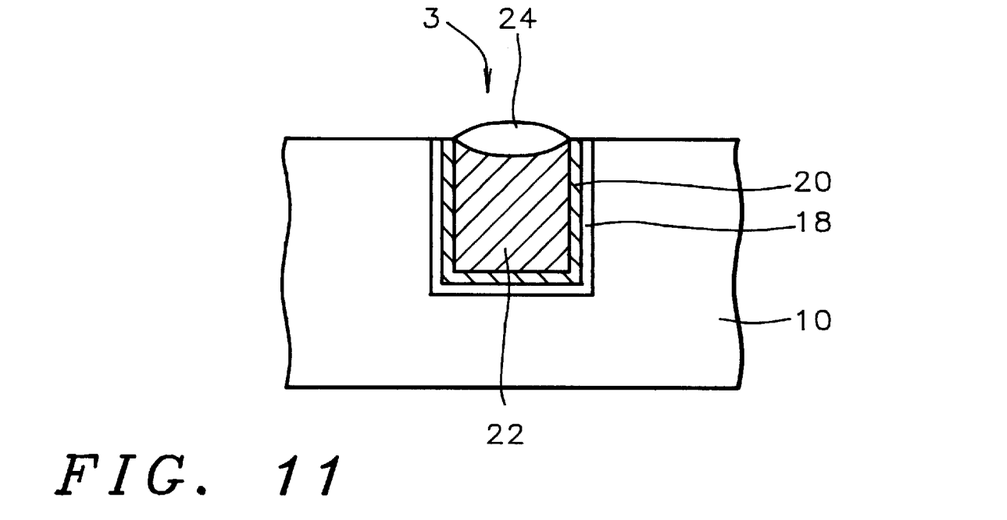

Now as shown in FIG. 11, the first and second silicon nitride layers 14 and 20 are removed from the top surface of the substrate 10 over the active device areas. Layers 20 and 14 are preferably removed by wet etching in a hot phosphoric acid, and the first thermal oxide layer 12 is removed by wet etching in a Buffered Oxide Etch (BOE) or in a dilute hydrofluoric acid ($HF/H_2O$) to complete the shallow trench isolation 3 and to expose the active device areas on the silicon substrate 10 for the next level of integration.

EXAMPLES

Figure 8B:
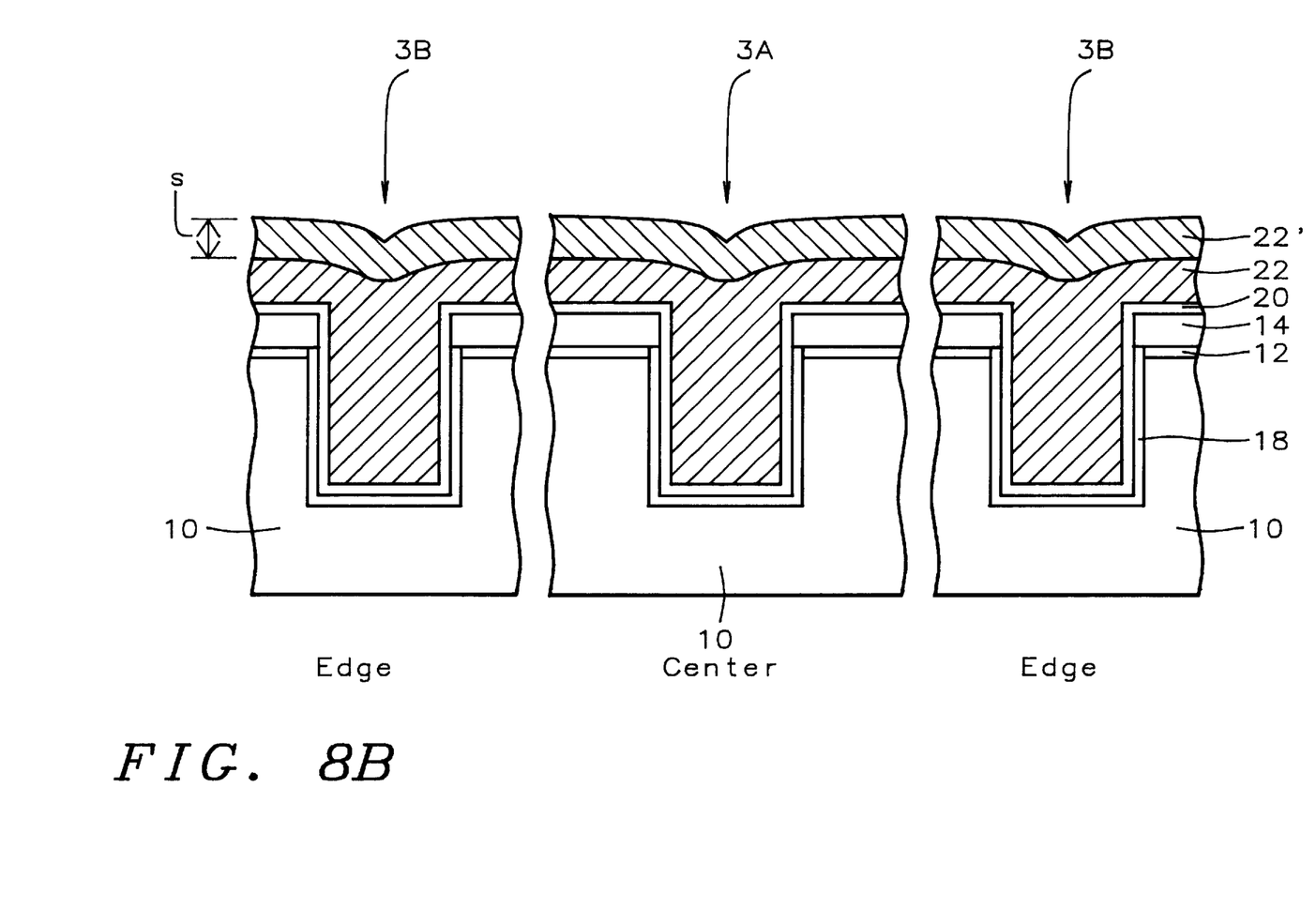
FIG. 8B depicts the composite polysilicon layer over trenches at both the center and edges of the wafer.

Now to better appreciate the advantages of this invention, one can calculate the removal rate difference between the center and the edge of the substrate, assuming the removal rate to be inversely proportional to the dopant concentration. Then the difference in depth between the center and edge of the substrate after different time intervals for different doping profiles can be calculated as listed in Tables I, II, and III. The removal rates across the substrate 10 are described with reference to Table I for undoped polysilicon, Table II for the linearly doped polysilicon, and Table III for the step-wise doped polysilicon layer with reference to FIG. 8B. FIG. 8B shows a cross-sectional schematic view of portions of the substrate 10 near the edges having trenches 3B and a portion near the center of the substrate having trench 3A. FIG. 8B also shows the filling of the trenches with the composite polysilicon layer (layers 22 and 22'). The calculated polishing removal rate at the center of the substrate was taken to be initially 1000 Angstroms per minute for the undoped and for each of the doped polysilicon layers. The first column in each table below represents the polishing time in one-minute intervals. The second column shows the cumulative thickness of the polysilicon removed at the center of the substrate, and the third column shows the thickness removed at the edges of the substrate. The fourth column shows the depth difference in thickness between the polysilicon removed at the center and at the edge of the substrate. As shown in Table I for the undoped polysilicon layer represented by the dopant curve 41 of FIG. 12, the polish-back rate is 1000 Angstroms per minute at the center and is 2000 Angstroms at the edge of the substrate, resulting in a non-uniform removal rate across the substrate. For example, after 3 minutes, 6000 Angstroms were removed at the edge of the substrate, while only 3000 Angstroms were removed at the center, resulting in a non-uniformity of 3000 Angstroms.

TABLE I

Undoped polysilicon removed by chem/mech polishing.

| Polish Time (Minutes) | Removal at Center (Angstroms) | Removal at Edge (Angstroms) | Depth Difference (Angstroms) |
| --- | --- | --- | --- |
| 1 | 1000 | 2000 | 1000 |
| 2 | 2000 | 4000 | 2000 |
| 3 | 3000 | 6000 | 3000 |

Figure 12:
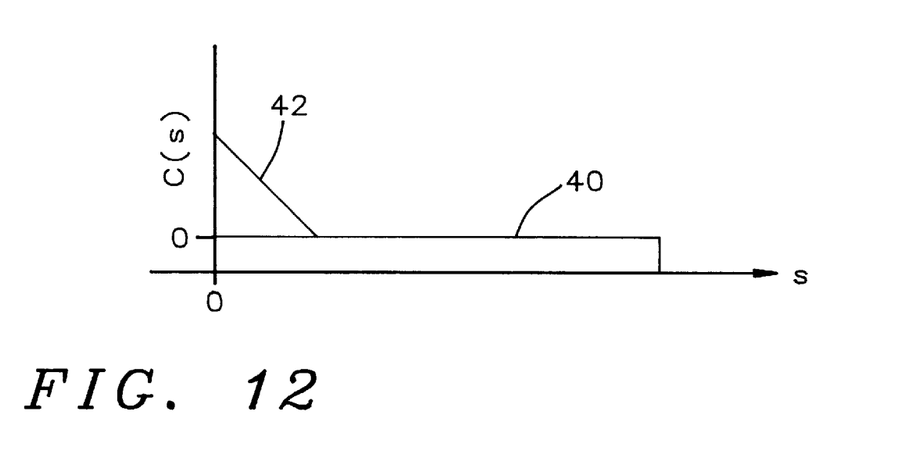
FIG. 12 shows a graph of a linearly decreasing dopant concentration C on an undoped polysilicon layer as a function of composite polysilicon layer depth S.
Figure 13:
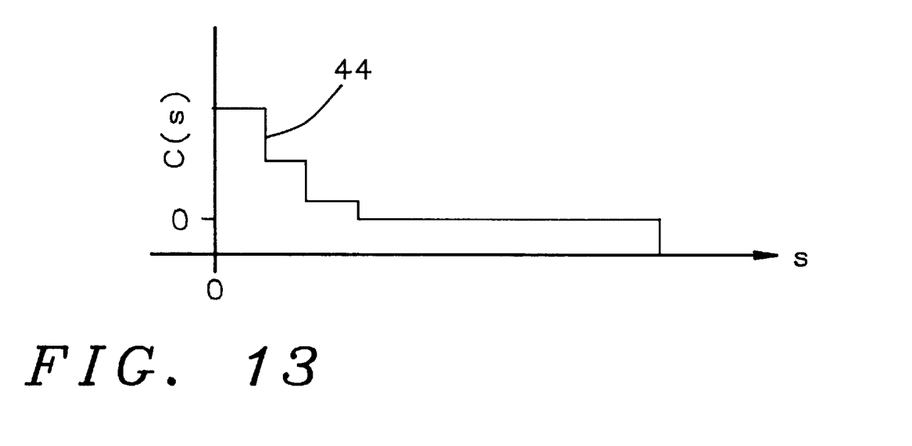
FIG. 13 shows a graph of the step-wise dopant concentration C versus the composite polysilicon layer depth S which further improves the global planarity across the wafer.

Referring now to Table II and the polysilicon layer having the linear decreasing dopant as depicted by curve 42 in FIG. 12, the removal rate due to the heavily doped polysilicon results in an improved uniformity having a difference in the amount removed of only 1750 Angstroms as shown after a 7-minute polish in column 4, which is substantially better than the undoped polysilicon which has a non-uniformity of 3000 Angstroms.

TABLE II

Linearly doped polysilicon removed by chem/mech polishing.

| Polish Time (Minutes) | Removal at Center (Angstroms) | Removal at Edge (Angstroms) | Depth Difference (Angstroms) |
| --- | --- | --- | --- |
| 1 | 1000 | 2000 | 1000 |
| 2 | 2000 | 3000 | 1000 |
| 3 | 2500 | 4000 | 1500 |
| 4 | 3000 | 4500 | 1500 |
| 5 | 3500 | 5000 | 1500 |
| 6 | 4000 | 5500 | 1500 |
| 7 | 4250 | 6000 | 1750 |

Referring to the step-wise dopant profile depicted by curve 44 in FIG. 13, Table III shows the cumulative removal of the polysilicon across the substrate after each one-minute interval. As clearly seen after polishing for 7 minutes, the cumulative thickness of polysilicon removed at the center of the substrate is 3625 Angstroms, while 3968.75 Angstroms are removed at the edge of the substrate, resulting in a much improved planarity having a non-uniform profile across the substrate of only 343.75 Angstroms, as indicated in column 4. This results in a better removal rate uniformity across the substrate (wafer).

TABLE III

Step-wise doped polysilicon removed by chem/mech polishing.

| Polish Time (Minutes) | Removal at Center (Angstroms) | Removal at Edge (Angstroms) | Depth Difference (Angstroms) |
| --- | --- | --- | --- |
| 1 | 1000 | 2000 | 1000 |
| 2 | 2000 | 3000 | 1000 |
| 3 | 2500 | 3500 | 1000 |
| 4 | 3000 | 3750 | 750 |
| 5 | 3250 | 3875 | 625 |
| 6 | 3500 | 3937.5 | 437.5 |
| 7 | 3625 | 3968.75 | 343.75 |

While the invention has been particularly shown and described with reference to the preferred embodiment thereof, it will be understood by those skilled in the art that various changes in form and details may be made without departing from the spirit and scope of the invention. Although the method is applied to the formation of shallow trench isolation, it should also be well understood that the method equally applies to the formation of deep trench isolation as is typically used for making bipolar transistor integrated circuits.

What is claimed is:

1. A method for fabricating shallow trench isolation on a semiconductor substrate having improved planarity comprising the steps of:

forming a first thermal oxide layer on said substrate;

depositing a first silicon nitride layer on said first thermal oxide layer;

forming trenches in said substrate by photoresist masking and anisotropic etching said first silicon nitride layer, said first thermal oxide layer and partially into said substrate;

forming a second thermal oxide layer in said trenches on said substrate;

depositing a conformal second silicon nitride layer in said trenches and elsewhere on said first silicon nitride layer;

depositing a conformal composite polysilicon layer having a lower undoped polysilicon layer filling said trenches and an upper gradient-doped polysilicon layer on said undoped polysilicon layer;

chemical/mechanically polishing back said conformal composite polysilicon layer to said second silicon nitride layer leaving portions of said undoped polysilicon layer in said trenches, and said gradient-doped polysilicon layer is polished back at a higher rate than said undoped polysilicon layer thereby providing improved surface planarity across said substrate;

selectively forming a third thermal oxide layer on said undoped polysilicon in said trenches while said first and second silicon nitride layers prevent thermal oxidation of said substrate;

removing said first and second silicon nitride layers and said first thermal oxide layer by wet etching thereby completing said shallow trench isolation.

2. The method of claim 1, wherein said first thermal oxide layer has a thickness of between about 200 and 300 Angstroms.

3. The method of claim 1, wherein said first silicon nitride layer has a thickness of between about 1500 and 2000 Angstroms.

4. The method of claim 1, wherein said trenches are etched to a depth of between about 0.35 and 0.5 micrometers (um) in said substrate.

5. The method of claim 1, wherein said second thermal oxide layer is grown to a thickness of between about 80 and 300 Angstroms.

6. The method of claim 1, wherein said second silicon nitride layer is deposited to a thickness of between about 250 and 600 Angstroms.

7. The method of claim 1, wherein said undoped polysilicon layer is deposited to a thickness of between about 7500 and 12000 Angstroms, and said gradient-doped polysilicon layer is deposited to a thickness of between about 2500 and 6000 Angstroms.

8. The method of claim 1, wherein said gradient-doped polysilicon layer of said composite polysilicon layer is doped with phosphorus varying in concentration from about 1.0 to 30.0 weight percent.

9. The method of claim 1, wherein said gradient-doped polysilicon layer of said composite polysilicon layer is achieved by a series of at least three dopant steps.

10. The method of claim 1, wherein said third thermal oxide layer is grown to a thickness of between about 100 and 1000 Angstroms.

11. The method of claim 1, wherein removal selectivity by chemical/mechanical polishing of said composite polysilicon layer to said second silicon nitride layer is at least greater than 15.

12. A method for fabricating shallow trench isolation on a semiconductor substrate having improved planarity comprising the steps of:

forming a first thermal oxide layer on said substrate;

depositing a first silicon nitride layer on said first thermal oxide layer;

forming trenches in said substrate by photoresist masking and anisotropic etching said first silicon nitride layer, said first thermal oxide layer and partially into said substrate;

forming a second thermal oxide layer in said trenches on said substrate;

depositing a conformal second silicon nitride layer in said trenches and elsewhere on said first silicon nitride layer;

depositing a conformal composite polysilicon layer having a lower undoped polysilicon layer filling said trenches and an upper gradient-doped polysilicon layer on said undoped polysilicon layer, said gradient-doped polysilicon layer is formed by a series of at least three dopant steps, each of said dopant steps having increased dopant concentration from said undoped polysilicon layer using phosphorus as said dopant;

chemical/mechanically polishing back said conformal composite polysilicon layer to said second silicon nitride layer leaving portions of said undoped polysilicon layer in said trenches, and said gradient-doped polysilicon layer is polished back at a higher rate than said undoped polysilicon layer thereby providing improved surface planarity across said substrate;

selectively forming a third thermal oxide layer on said undoped polysilicon in said trenches while said first and second silicon nitride layers prevent thermal oxidation of said substrate;

removing said first and second silicon nitride layers and said first thermal oxide layer by wet etching thereby completing said shallow trench isolation.

13. The method of claim 12, wherein said first thermal oxide layer has a thickness of between about 200 and 300 Angstroms.

14. The method of claim 12, wherein said first silicon nitride layer has a thickness of between about 1500 and 2000 Angstroms.

15. The method of claim 12, wherein said trenches are etched to a depth of between about 0.35 and 0.5 micrometers (um) in said substrate.

16. The method of claim 12, wherein said second thermal oxide layer is grown to a thickness of between about 80 and 300 Angstroms.

17. The method of claim 12, wherein said second silicon nitride layer is deposited to a thickness of between about 250 and 600 Angstroms.

18. The method of claim 12, wherein said undoped polysilicon layer is deposited to a thickness of between about 7500 and 12000 Angstroms, and said gradient-doped polysilicon layer is deposited to a thickness of between about 2500 and 6000 Angstroms.

19. The method of claim 12, wherein said gradient-doped polysilicon layer doped with said phosphorus varies in concentration from about 1.0 to 30.0 weight percent.

20. The method of claim 12, wherein said third thermal oxide layer is grown to a thickness of between about 100 and 1000 Angstroms.

21. The method of claim 12, wherein removal selectivity by chemical/mechanical polishing of said composite polysilicon layer to said second silicon nitride layer is at least greater than 15.

\* \* \* \* \*